United States Patent [19]

Agrawal et al.

[11] Patent Number: 5,737,767
[45] Date of Patent: Apr. 7, 1998

[54] SYSTEM FOR RECONFIGURING THE WIDTH OF AN X-Y RAM

[75] Inventors: Ram Agrawal, Round Rock; Michael Spak, Kyle, both of Tex.

[73] Assignee: Advanced Micro Devices, Inc., Sunnyvale, Calif.

[21] Appl. No.: 555,081

[22] Filed: Nov. 8, 1995

[51] Int. Cl.$^6$ ................................. G06R 12/00
[52] U.S. Cl. .............. 711/171; 711/104; 364/DIG. 1
[58] Field of Search ................ 365/230.02, 230.03, 365/230.06; 395/307

[56] References Cited

U.S. PATENT DOCUMENTS

| | | | |
|---|---|---|---|
| 4,667,308 | 5/1987 | Hayes et al. | 365/230.02 |
| 4,831,519 | 5/1989 | Morton | 395/307 |
| 4,893,279 | 1/1990 | Rahman et al. | 365/230.03 |
| 5,128,897 | 7/1992 | McClure | 365/230.06 |
| 5,388,072 | 2/1995 | Matick et al. | 365/230.03 |
| 5,396,608 | 3/1995 | Garde . | |
| 5,406,525 | 4/1995 | Nicholes . | |
| 5,566,371 | 10/1996 | Ogawa | 365/230.03 |

OTHER PUBLICATIONS

International Search Reported for PCT/US96/16460 mailed Jan. 24, 1997.

*Primary Examiner*—Tod R. Swann
*Assistant Examiner*—David C. Langjahr
*Attorney, Agent, or Firm*—Conley, Rose & Tayon; Jeffrey C. Hood; Robert C. Kowert

[57] ABSTRACT

A x-y RAM array with a reconfigurable bit width is provided. The array contains a RAM cell columns organized into a number of column groups where the number of groups determines the bit width of the memory. The number of columns in each group are configurable thereby configuring the number of groups and thus the bit width of the memory. Multiplexor logic selects a column from each group to be accessed and passgate logic determines how the multiplexor logic is combined and thus determined the column group configuration. Decode logic provides the appropriate select signals to the multiplexor logic for selecting from the configured number of columns in each group.

20 Claims, 7 Drawing Sheets

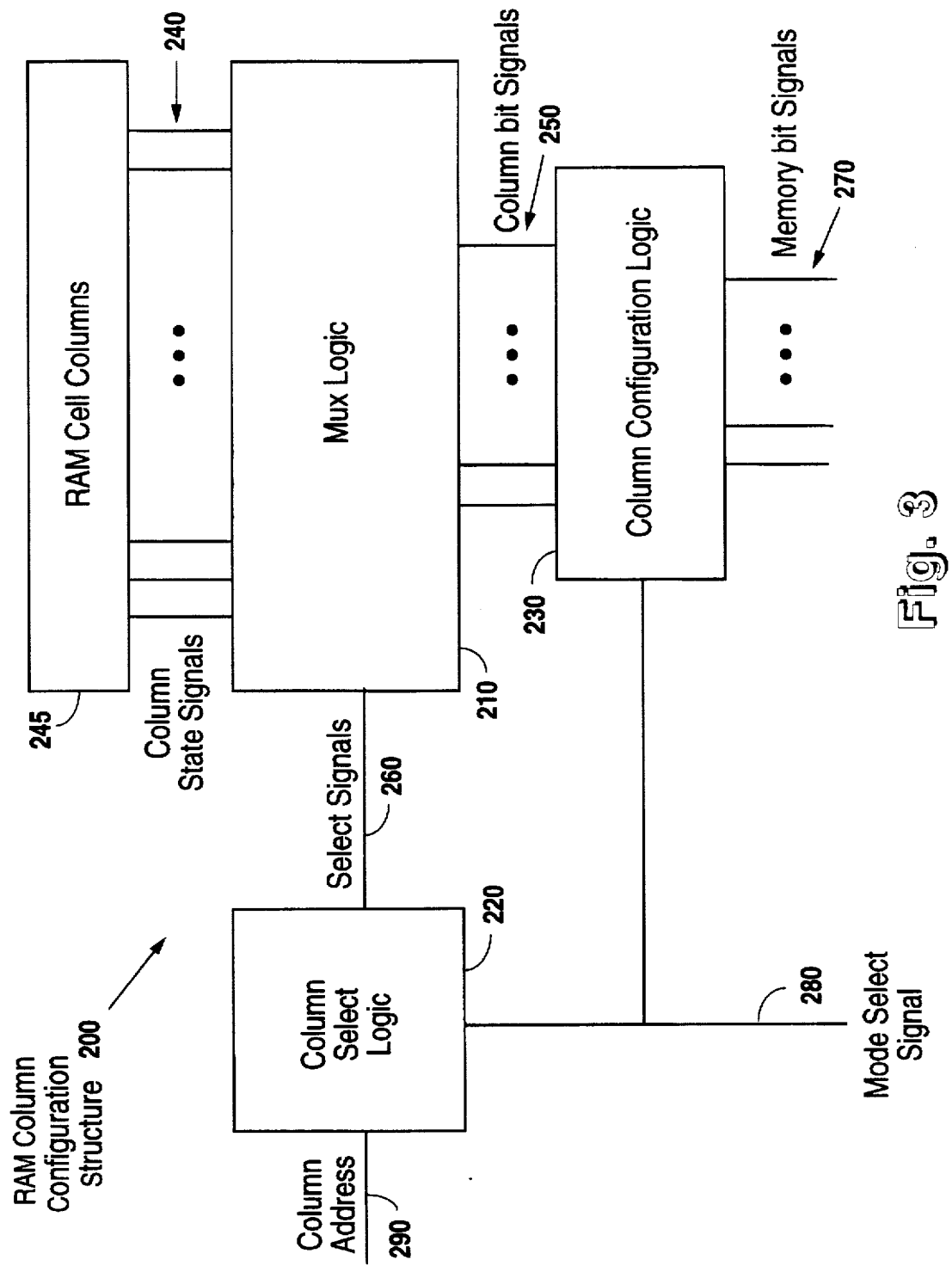

SYSTEM FOR RECONFIGURING THE WIDTH OF AN X-Y RAM

BACKGROUND OF THE INVENTION

1. Field of the Invention

The present invention relates to memory arrays, and more specifically to a system and method for reconfiguring the width of an x-y random access memory (RAM) array.

2. Description of the Related Art

Referring to FIG. 1, a typical random access memory array structure 100 according to the prior art is illustrated. As shown, a prior art random access memory array structure 100 comprises an array 110 which includes a plurality of memory cells arranged in an x-y array organization. The x-y array can be envisioned as an array of rows and columns of memory cells where one bit is stored in a cell. A particular cell, or bit, is accessed by selecting the appropriate row and column. A row is selected by providing a row address 122 through row address buffers 120 to row decoder 130, where the row address is decoded. The row decoder 130 outputs row select signals 132 to the array 110 to select the addressed row 112. A column is selected by providing a column address 142 through column address buffers 140 to column selector 150. The column selector 150 receives the column address from the column address buffers 140 and generates column select signals 152 to select the addressed column 114 in the array 110. The RAM cell 116 determined by the selected column 114 and row 112 is then accessed through the data transceiver 160. The access type (read or write) is determined by a read/write signal 172 received through a buffer 170. It is noted that the array structure 100 includes a plurality of rows, columns, and cells, and only a selected row 112, column 114, and cell 116 are shown in FIG. 1 for simplicity.

A number of RAM arrays are combined in parallel to create a RAM structure wherein a plurality of bits are accessed when the same row and column are selected in each of the arrays combined in parallel. When the same respective row and column are accessed in a plurality of arrays combined in parallel, a number of bits equal to the number of arrays combined in parallel are accessed. Each accessed bit corresponds to the same cell location in each array. The number of bits accessed is referred to as the width of the memory structure. When the plurality of memory arrays are combined in parallel within the same integrated circuit (IC), the integrated circuit is referred to as a M×N memory, where M is the number of cells in each array, or size, and N is the number of arrays combined in parallel, or width. For example, an integrated circuit containing 16 arrays in parallel wherein each array comprises 256 rows and 32 columns is referred to as a 8192×16 memory, or more commonly a 8K×16 memory.

Random access memory, such as the x-y RAM array described above, is frequently used to provide storage for data and instructions in conjunction with a processor. The width of the memory is generally chosen to correspond to the data or instruction width utilized by the processor. The memory width utilized by the processor is referred to as the word width. The processor accesses a word by providing a row address and column address to the RAM. Frequently, the row address and column address are multiplexed or partially multiplexed on the same signals to obtain a smaller more cost effective structure. Generally, the row address is latched in the DRAM by a row address strobe (RAS) and the column address is latched by a column address strobe (CAS). A given row and column address selects a word location to be read or written in the memory array.

Some processors, such as some digital signal processors (DSPs), utilize a first word size for instructions and a second different word size for data. For optimum performance and efficiency, it is desirable for the processor to access instruction memory at the processor's instruction width, and to access data memory at the processor's data width. Also, some applications or operational modes may require more instruction memory and less data memory than other applications or modes. Conversely, some applications or modes may require less instruction memory and more data memory than others.

One solution is to have two separate memories, wherein one memory has a width corresponding to the processor's instruction width, and another memory has a width corresponding to the processor's data width. This solution has the disadvantage of requiring two separate memories, which increases the cost and required area. Furthermore, the amount of memory for instructions and the amount of memory for data cannot be adjusted for different applications or operating modes.

A second solution is to provide two different memory arrays with different widths within the same integrated circuit. If the memory is needed for instructions, then the memory array having a width corresponding to the instruction width is selected. If a the memory is needed for data, the array having a width corresponding to the data width is selected. However, in this solution one of the memory arrays is always unselected and thus not used.

A third solution is to use a single larger memory having a width corresponding to the larger of the instruction width or the data width. A portion of the memory would be used for instructions and a portion used for data. However, the memory portion used for the shorter word width does not use the memory cells corresponding to the difference between the two widths. Thus, a substantial portion of the memory is wasted.

Therefore, an improved memory is desired wherein the memory width is reconfigurable between a plurality of widths so that all the memory cells are available for use regardless of the width selected.

SUMMARY OF THE INVENTION

The present invention comprises a random access memory (RAM) array with a reconfigurable bit width or word width. In one embodiment, a reconfigurable x-y RAM array is provided which includes a memory array comprised of a plurality of RAM cell columns. The RAM cell columns are organized into a number of groups where the number of groups corresponds to the bit width of the memory. Each group contains an equal number of columns so that the number of columns in a group multiplied by the number of groups equals the total number of columns in the array. The number of columns in a group is reconfigurable according to the present invention. Thus, when the number of columns in a group is smaller, the number of groups is larger and when the number of columns in a group is larger, the number of groups is smaller. Thus the bit width of the memory is reconfigurable by reconfiguring the number of columns in a group, since the bit width of the memory corresponds to the number of groups.

To access a word stored in the array, the RAM decodes an address and selects one bit from each column group. Thus, the word size stored by the RAM is determined by the number of columns groups configured in the array.

The present invention provides multiplexor (mux) logic coupled to each column. Column select logic decodes a memory address and provides select signals corresponding to the address to the mux logic. The mux selects a particular column in the group to be accessed and outputs a column bit signal indicative of the memory state of the selected column.

Column configuration logic is coupled to the mux logic and combines the mux outputs into memory bit signals. The mux outputs combined by the column configuration logic determine the size of the column groups from which a memory bit signal is selected. The column configuration logic may be placed in different modes to configure different column group sizes and thus to reconfigure the bit width of the memory according to the present invention.

The column select logic is responsive to the configuration mode and decodes the address for the appropriate column group size. For example, consider an array comprising 24 columns. If the column configuration logic combines the mux logic outputs so that the mux logic selects from three groups of eight columns each, then the column select logic performs the address decode to select from eight, or in other terms, the column select logic decodes to eight. In this mode the memory bit width is three. If the mode is changed so that the column configuration logic combines the mux logic outputs so that the mux logic selects from six groups of four columns, then the column select logic decodes to four and the memory bit width is six.

BRIEF DESCRIPTION OF THE DRAWINGS

A better understanding of the present invention can be obtained when the following detailed description of the preferred embodiment is considered in conjunction with the following drawings, in which:

FIG. 3 is a block diagram of a RAM column configuration structure according to one embodiment of the present invention;

Figure 1:
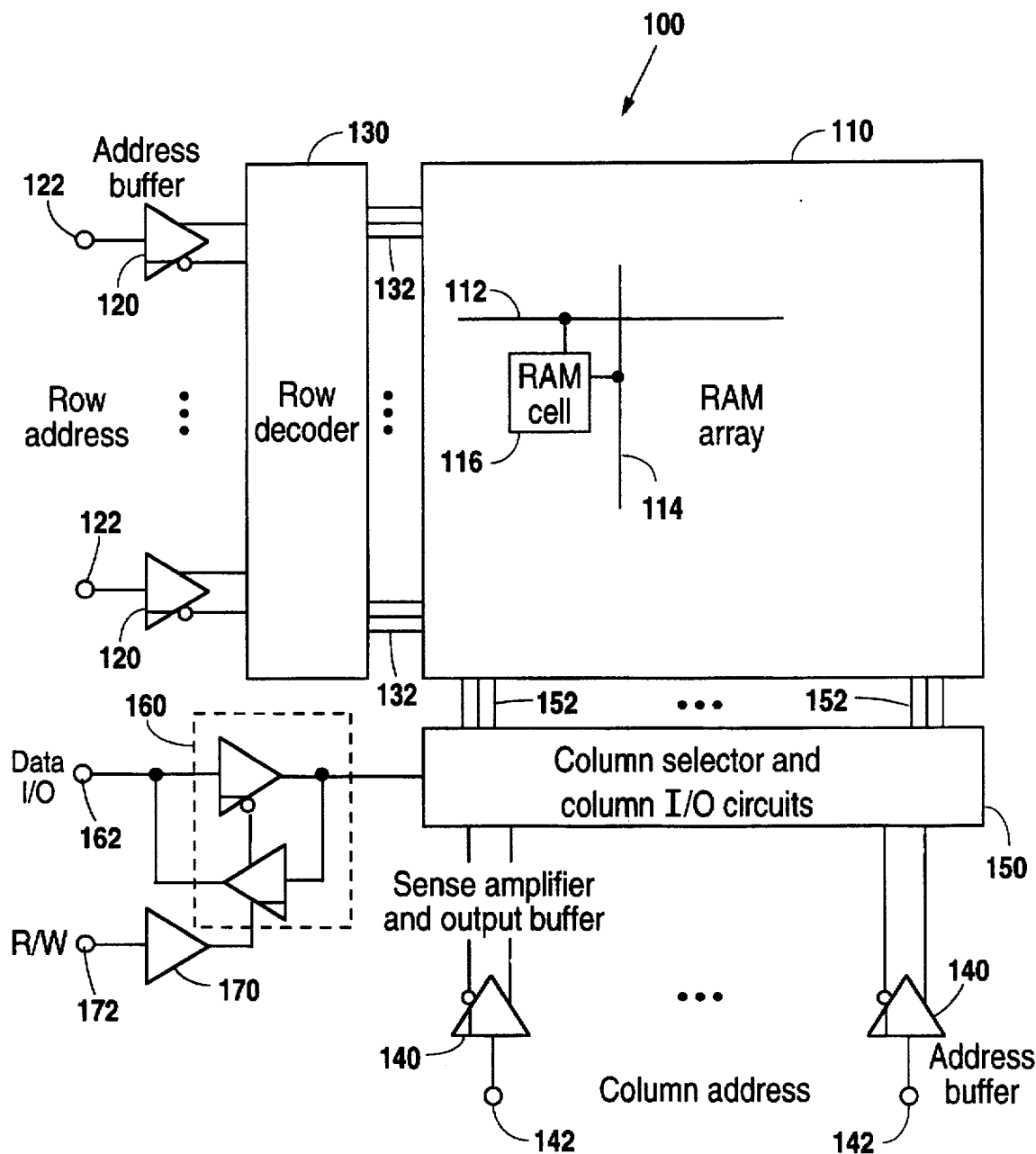
FIG. 1 is a diagram illustrating a random access memory array according to the prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
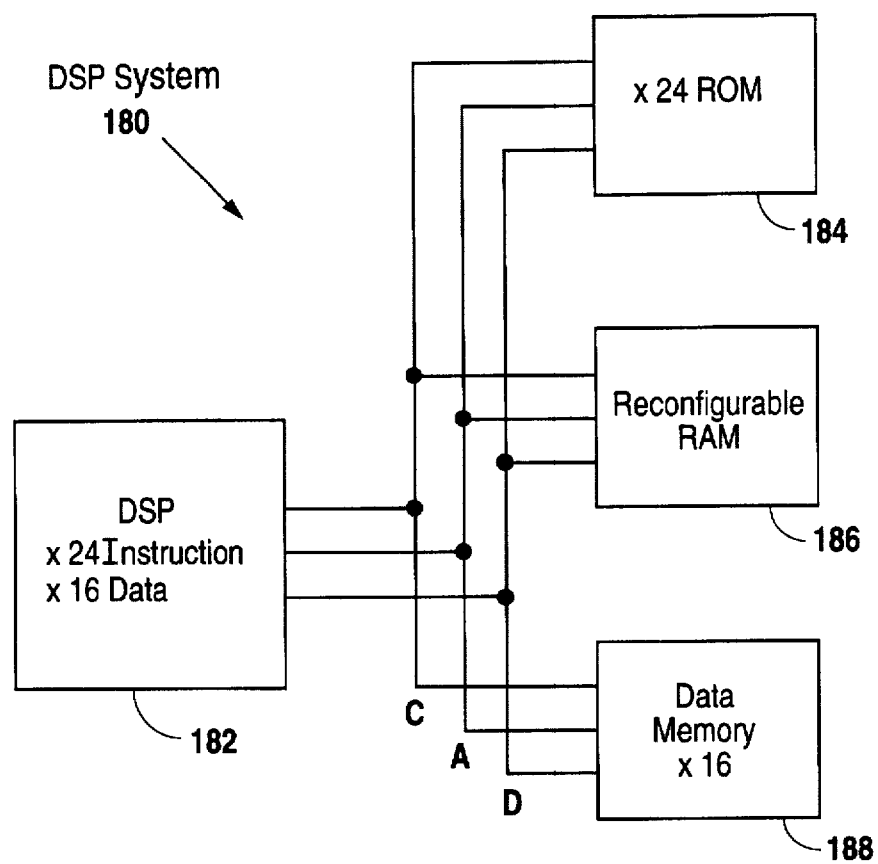
FIG. 2 is a block diagram illustrating a digital processing system using reconfigurable random access memory arrays according to one embodiment of the present invention.

Referring now to FIG. 2, a block diagram is shown illustrating a digital processing system 180 using a reconfigurable random access memory array 186 according to one embodiment of the present invention. It is noted that the present invention may be used in any of various systems as desired.

The digital signal processor 182 utilizes 24 bit instructions and 16 bit data. Therefore, for optimum performance, memory with a 24 bit width is used for instruction memory 184, and memory with a 16 bit width is used for data memory 188. The reconfigurable RAM 186, is an x-y RAM array with a memory bit width configurable between 24 bits and 16 bits. Use of the reconfigurable RAM 186 is advantageous in the digital signal processing system 180 for applications which require more instruction memory than is available in the instruction memory 184. For these applications, the reconfigurable RAM 186 is configured for a 24 bit width and used as extra instruction memory. For applications which do not require extra instruction memory and/or require more data memory than available in data memory 188, the reconfigurable RAM is configured for a 16 bit width and used as extra data memory.

Other components comprising the digital processing system 180, such as input/output circuitry, are not shown since their presence on the drawing is not necessary for an understanding of the invention. Also, other embodiments of the invention are similar to the embodiment shown in FIG. 2 but employ a plurality of reconfigurable RAM arrays. Further embodiments utilize different memory bit widths. It is also noted that the present invention may be used in any of various types of systems employing memory.

Referring now to FIG. 3, a block diagram is shown of a RAM column configuration structure 200 according to one embodiment of the present invention for use in a reconfigurable random access memory, such as the reconfigurable RAM 186 of FIG. 2. The reconfigurable random access memory comprises an x-y random access memory array including a plurality of RAM cell rows and columns 245. The RAM cell columns 245 are organized into a number of parallel groups where the number of groups corresponds to the bit width of the memory. Each group contains an equal number of columns so that the number of columns in a group multiplied by the number of groups equals the total number of columns in the array.

This embodiment of the present invention provides multiplexor (mux) logic 210 coupled to the RAM cell columns 245. The mux logic 210 receives column state signals 240 for each column. The column state signals 240 indicate the memory state of a row of selected cells across the columns. A row of cells across the columns is selected by providing a row address to the array, as is well understood in the art. The associated row decode logic is not necessary for an understanding of the invention and thus is not shown in FIG. 3.

Column select logic 220 receives and decodes a memory column address 290 and provides the select signals 260, corresponding to the address 290, to the mux logic 210. The mux logic 210 operates to select a particular column in each column group to be accessed and outputs column bit signals 250 indicative of the memory state of each selected column. The column select logic 220 and mux logic 210 together may be referred to as select logic.

Column configuration logic 230 is coupled to the mux logic 210 and combines the column bit signal 250 into memory bit signals 270. The manner in which the column configuration logic 230 combines the column bit signals 250 determines the number of columns in the column group from which one of the memory bit signals 270 is selected.

A mode select signal 280 is provided to the column configuration logic 230 and to the column select logic 220. The state of the mode select signal 280 places the column configuration logic 230 in different modes to configure different column group sizes. The column select logic 220 also responds to the state of the mode select signal 280 and decodes the address 290 for the appropriate column group size.

Figure 4:
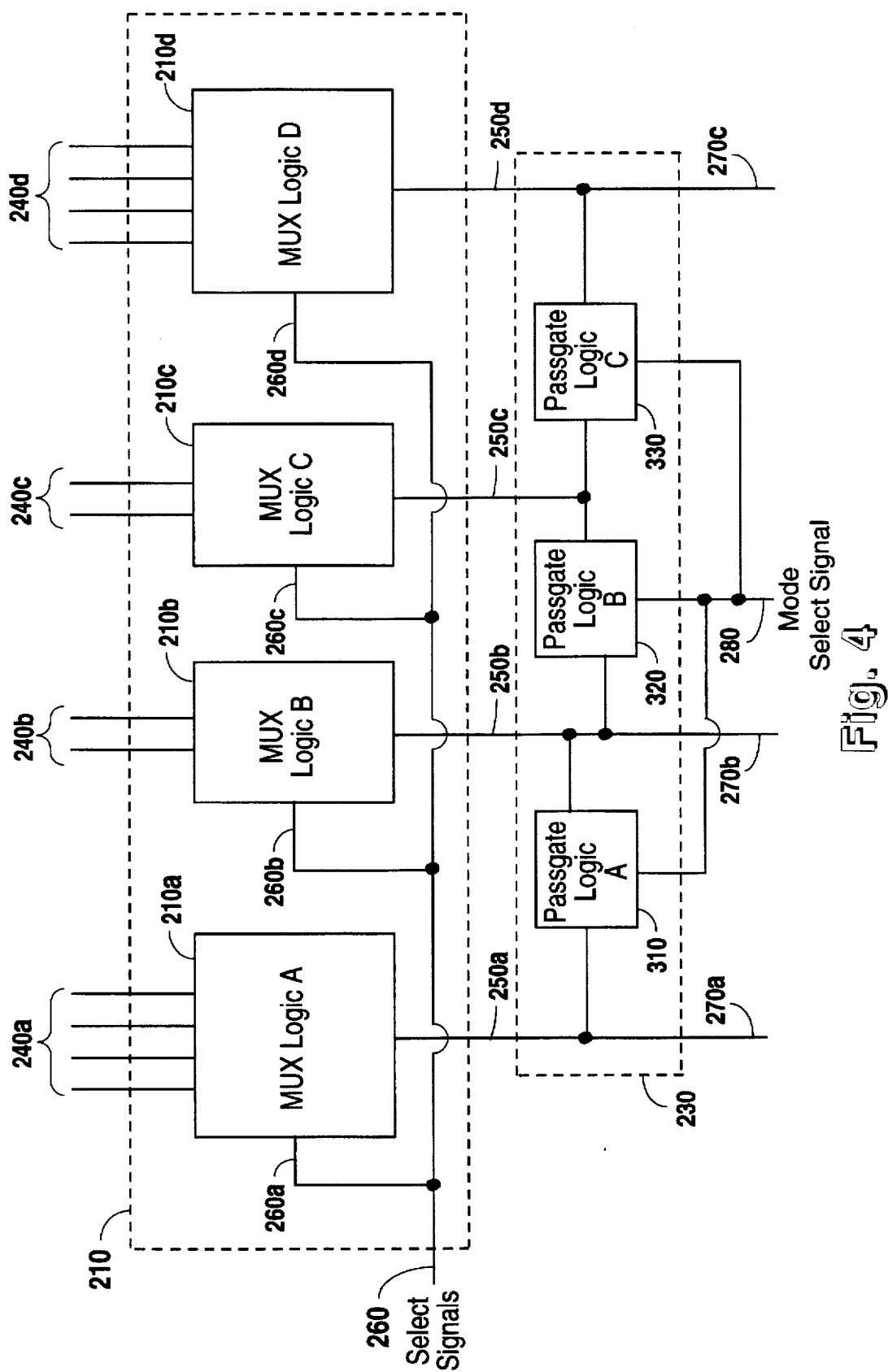
FIG. 4 is a block diagram of mux logic and column configuration logic for a column configuration structure according to one embodiment of the present invention.

Referring now to FIG. 4, a block diagram is shown for one embodiment of mux logic 210 and column configuration logic 230 for the column configuration structure 200 of FIG. 3. The mux logic 210 contains four subelements of mux logic: mux logicA 210a, mux logicB 210b, mux logicC 210c, and mux logicD 210d. Mux logicA 210a and mux logicD 210d each receive four column state signals 240a and 240d, respectively. Mux logicB 210b and mux logicC 210c each receive two column state signals 240b and 240c, respectively. Each mux logic subelement 210a, 210b, 210c, 210d receives the appropriate select signals 260 for each selecting from column state signal 240a, 240b, 240c, 240d. Each mux logic subelement 210a, 210b, 210c, 210d generates a column bit signal 250a, 250b, 250c, 250d, respectively, corresponding to the selected column state signal.

Column configuration logic 230 receives the column bit signals 250a, 250b, 250c, 250d. The column configuration logic includes passgate logic elements: passgate logicA 310, passgate logicB 320, and passgate logicC 330. Passgate logicA 310 is coupled the column bit signal 250b from mux logicB 210b and to the column bit signal 250a from mux logicA 210a. Passgate logicB 320 is coupled the column bit signal 250c from mux logicC 210c and to the column bit signal 250b from mux logicB 210b. Passgate logicC 330 is coupled the column bit signal 250c from mux logicC 210c and to the column bit signal 250d from mux logicD 210d. Each passgate logic element 310, 320, 330 operates in an on state or an off state. In the on state, the passgate logic elements 310, 320, 330 connect the signals to which they are coupled, and in the off state, the passgate logic elements 310, 320, 330 separate the signals to which they are coupled.

Each of the passgate logic elements 310, 320, 330 receive the mode select signal 280. The mode select 280 selects between a first operating mode and a second operating mode. In the first operating mode, passgate logicA 310 and passgate logicC 330 are in the off state and passgate logicB 320 is the on state. In the second operating mode passgate logicA 310 and passgate logicC 330 are in the on state and passgate logicB 320 is the off state.

Thus, in the first operating mode, column bit signal 250b and column bit signal 250c are combined to form memory bit signal 270b, and column bit signal 250a and column bit signal 250d separately form memory bit signal 270a and memory bit signal 270c, respectively. Therefore, in the first operating mode, memory bit signal 270a corresponds to one of the four column state signals 240a received by mux logicA 210a, memory bit signal 270b corresponds to one of the four column state signals 240b, 240c received by mux logicB 210b and mux logicC 210c, and memory bit signal 270c corresponds to one of the four column state signals 240c received by mux logicC 210c.

In the second operating mode, column bit signal 250b is combined with column bit signal 250a to form memory bit signal 270a and column bit signal 250c is combined with column bit signal 250d to form memory bit signal 270c. Memory bit signal 270b is not used in the second operating mode, as explained below. Therefore, in the second operating mode, memory bit signal 270a corresponds to one of the six column state signals 240a, 240b received by mux logicA 210a and mux logicB 210b, and memory bit signal 270c corresponds to one of the six column state signals 240c, 240d received by mux logicC 210c and mux logicD 210d.

Accordingly, the memory configuration structure of this embodiment provides for accessing of three column groups of four columns each in a first operating mode, and for accessing two column groups of six columns each in a second operating mode. Therefore, the corresponding memory bit width is three for the first operating mode and two for the second mode. It is noted that the described structure can be repeated within a x-y RAM array to provide larger memory bit widths. For repetitions of the aforedescribed embodiment, the total memory bit width in the second operating mode is two-thirds the total memory bit width of the first operating mode.

In other embodiments, the aforedescribed embodiment is modified for more than two operating modes wherein more than two different memory bit widths are selected. Further embodiments modify the aforedescribed embodiment so that different numbers of column state signals are received by the mux logic elements. Also, some embodiments provide a different ratio of bit widths between operating modes. It is also noted that the term "column" and the term "row" are relative terms and in some embodiments of the invention aforementioned columns are referred to as rows.

Figure 5:
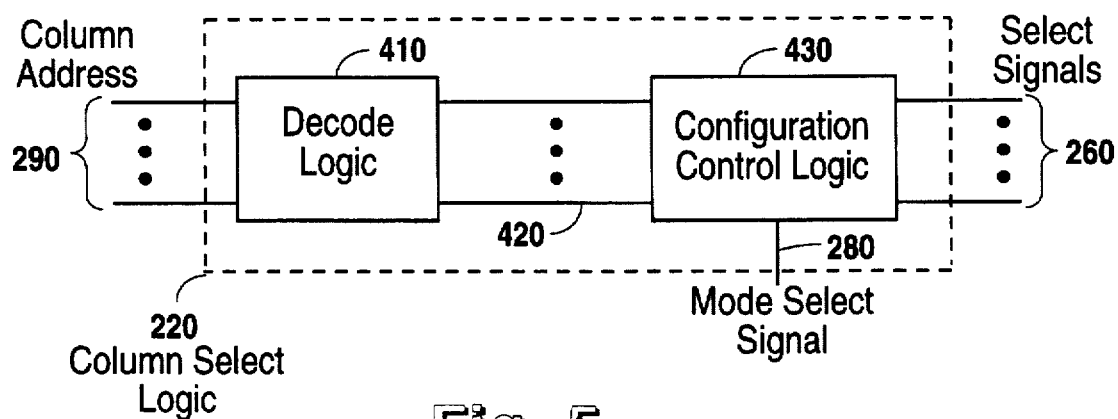
FIG. 5 is a block diagram of column select logic for a column configuration structure according to one embodiment of the present invention.

Referring now to FIG. 5, a block diagram is shown for one embodiment of column select logic 220 for the column configuration structure 200 of FIG. 3. The column select logic 220 contains decode logic 410 and configuration control logic 430.

The decode logic 410 receives the columns address 290 and provides a binary decode 420 of the column address 290 to the configuration control logic 430. The configuration control logic 430 also receives the mode select signal 280. When the mode select signal 280 indicates the first operating mode, the configuration control logic 430 generates the column select signals 260 for selecting one column from each of three groups of four columns. When the mode select signal 280 indicates the second operating mode, the configuration control logic 430 generates the column select signals 260 for selecting one column from each of two groups of six columns.

Figure 6:
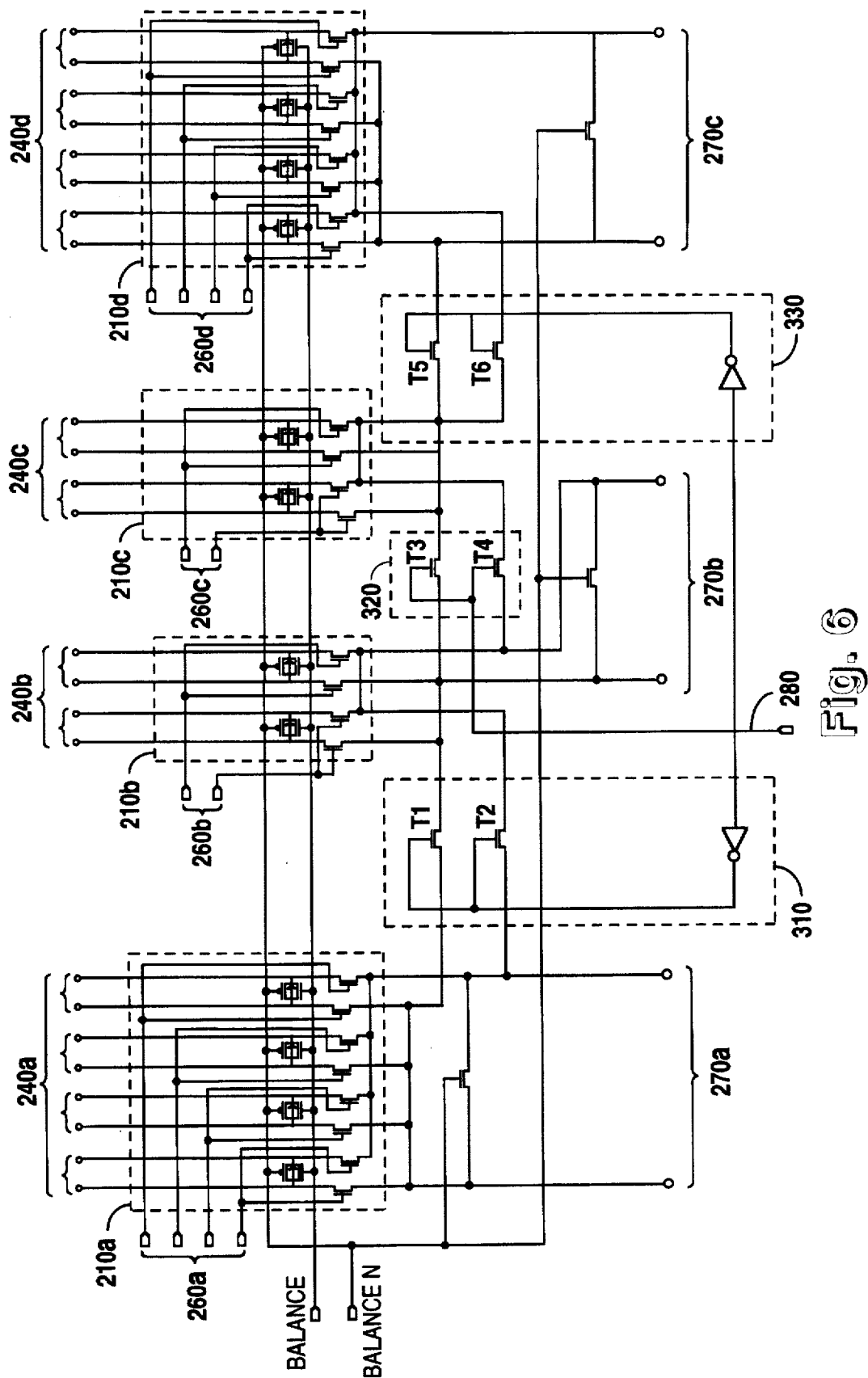
FIG. 6 is a schematic diagram of mux logic and column configuration logic for a column configuration structure according to one embodiment of the present invention.

Referring now to FIG. 6, a schematic diagram is shown for one embodiment of the mux logic subelements 210a, 210b, 210c, 210d and passgate logic elements 310, 320, 330 for the mux logic 210 and column configuration logic of FIG. 4. Note that the column state signals 240a, 240b, 240c, 240d and the memory bit signals 270a, 270b, 270c are shown as signal pairs. This signal pair implementation in RAMs is well understood in the art.

The mux logic subelements 210a, 210b, 210c, 210d include passgates which perform the multiplexing operation. Mux logic subelement 210a is now described as an example. Each one of four passgates connects to one of the column state signals 240a. The passgates are controlled by the column select signals 260a. The outputs of the passgates are coupled to the output of passgate logic 310 to form the memory bit signal 270a. The passgate logic elements 310, 320, 330 receive the mode select signal 280 and comprise passgate pairs T1, T2, T3, T4, T5, T6, respectively. The operation of the embodiment of FIG. 5 is as described for FIG. 3 so that in the first operating mode memory bit signal 270a is selected by mux logic subelement 210a, memory bit signal 270b is selected by mux logic subelements 210b and 210c, and memory bit signal 270c is selected by mux logic subelement 210d. In the second operating mode, memory bit signal 270a is selected by mux logic subelements 210a and 210b, and memory bit signal 270c is selected by mux logic subelements 210c and 210d.

Figure 7:
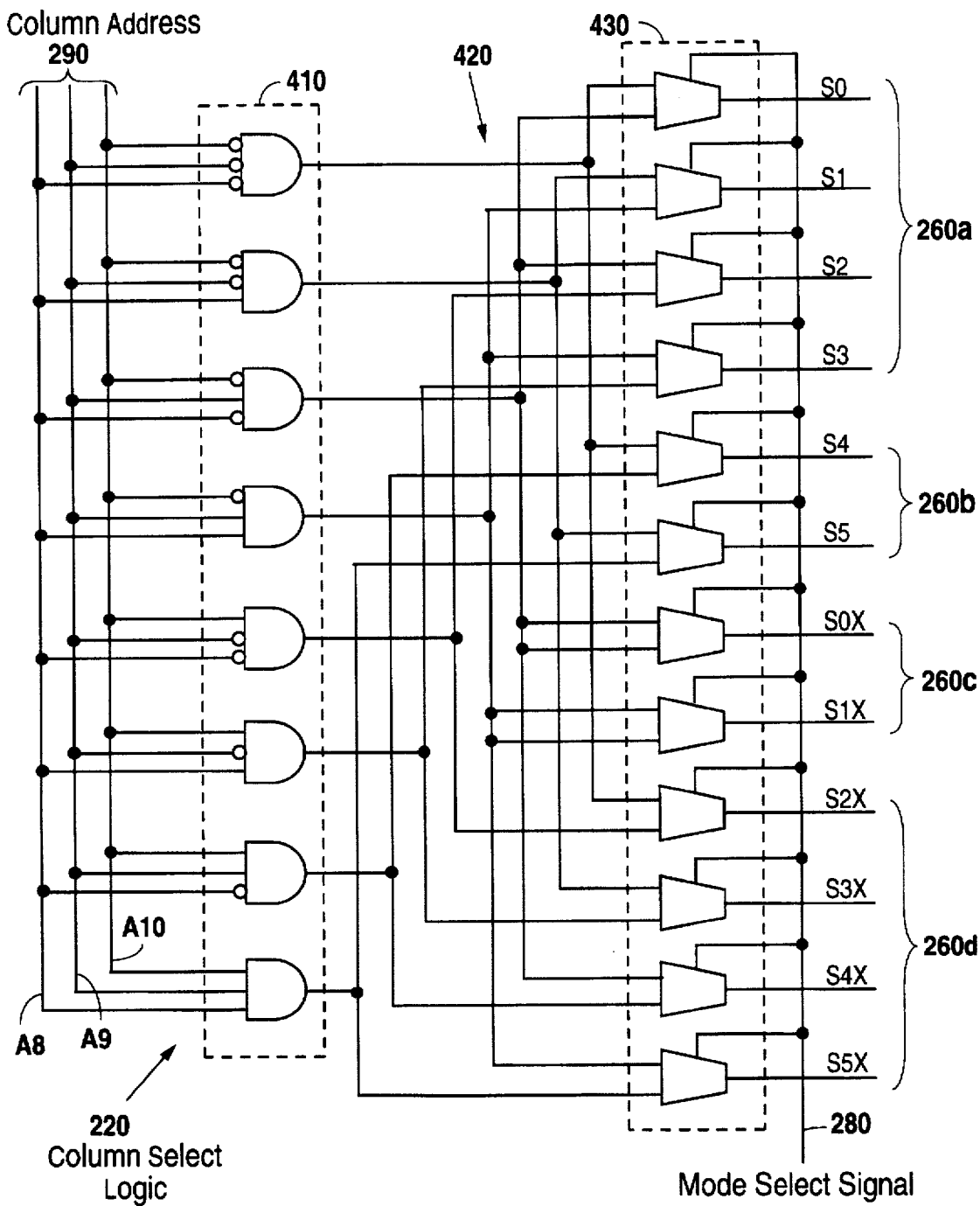
FIG. 7 is a schematic diagram for column select logic for a column configuration structure according to one embodiment of the present invention.

Referring now to FIG. 7, a schematic diagram is shown for one embodiment of the decode logic 410 and configuration control logic 430 column select logic 220 of FIG. 5. The decode logic 410 receives the column address signals 290. A binary decode of the address signals 290 is performed by the three-input NAND gates shown within the dashed box representing the decode logic 410. The configuration control logic 430 receives the binary decode of the column address 290 and the mode select signal 280. The 2–1 mux gates of configuration control logic 430 operate to provide the column select signals 260a, 260b, 260c, 260d so that when the mode select signal 280 indicates the first operating mode, the configuration control logic 430 generates the column select signals 260a, 260b, 260c, 260d for selecting one column from each of three groups of four columns. When the mode select signal 280 indicates the second operating mode, the configuration control logic 430 generates the column select signals 260a, 260b, 260c, 260d for selecting one column from each of two groups of six columns.

Figure 8:
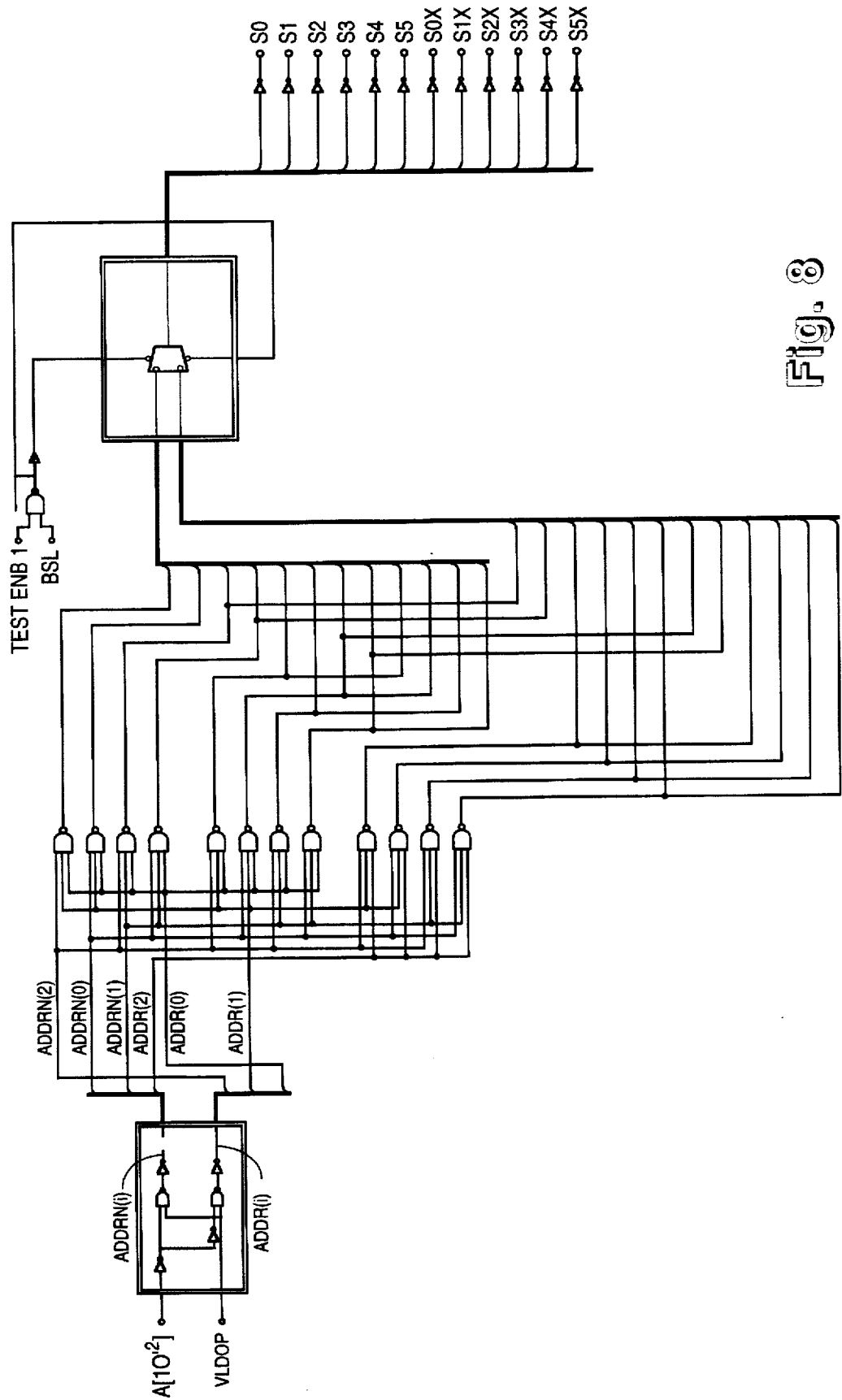
FIG. 8 is a schematic diagram for column select logic for a column configuration structure according to an alternate and preferred embodiment of the present invention.

Table 1 below is a truth table for the schematic of FIG. 7. The table shows which select signals 260 are active for a given column address. The schematic of FIG. 7 and Table 1 show just one embodiment in the present invention. FIG. 8 illustrates an alternate and preferred embodiment of the invention. It is noted that the implementation of other embodiments may vary from what is indicated in FIGS. 7 and 8 and Table 1.

TABLE 1

Column Select Logic Truth Table

| Mode 1 | | Mode 2 | |
|---|---|---|---|
| A10, A9, A8 | Active Signals | A10, A9, A8 | Active Signal |
| 000 | S0, S4, S2X | 010 | S0, S0X |
| 001 | S1, S5, S3X | 011 | S1, S1X |
| 010 | S2, S0X, S4X | 100 | S2, S2X |
| 011 | S3, S1X, S5X | 101 | S3, S3X |
| 1XX | n/a | 110 | S4, S4X |
| | | 111 | S5, S5X |
| | | 00X | n/a |

The invention described in the above detailed description is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A reconfigurable x-y memory system for storing words of information comprising bits, and wherein said words have a width, the x-y memory system comprising:

a memory array including a plurality of RAM columns;

column configuration logic including a first configuration mode to configure said plurality of RAM columns in a first number of groups, wherein said x-y memory system has a first word width in said first configuration mode, and including a second configuration mode to configure said plurality of RAM columns in a second number of groups, wherein said x-y memory system has a second word width in said second configuration mode; and select logic which selects one bit from each one of said first number of groups when said column configuration logic is in said first configuration mode, and selects one bit from each one of said second number of groups when said column configuration logic is in said second configuration mode;

wherein said width is determined by said first number when said column configuration logic is in said first configuration mode, and wherein said width is determined by said second number when said column configuration logic is in said second configuration mode.

2. The x-y memory system according to claim 1, wherein said select logic comprises:

select circuitry which receives an address and provides a plurality of select signals;

mux circuitry which is coupled to said plurality of RAM columns and receives said plurality of select signals;

wherein said mux circuitry selects one of said plurality of RAM columns from each one of said first number of groups when said column configuration logic is in said first configuration mode, and from each one of said second number of groups when said column configuration logic is in said second configuration mode; and wherein said select logic provides a plurality of bit signals corresponding to said RAM columns selected by said mux circuitry.

3. The array of claim 2, wherein said column configuration logic comprises a plurality of passgate circuits coupled to said circuitry operating to access, wherein said plurality of passgate circuits combines said plurality of bit signals into a first word group in said first configuration mode and into a second word group in said second configuration mode, whereby said plurality of RAM columns is configured in said first number of groups for said first configuration mode and configured in said second number of groups for said second configuration mode.

4. A memory device for storing information organized in words comprising a number of bits, wherein the number of bits in each of the words comprises the word width, wherein words are stored in the memory in locations indicated by addresses, wherein a particular word is accessed by providing the address for the particular word to the memory, and wherein the word width of the words stored in said memory is reconfigurable, the memory device comprising:

a plurality of memory columns, wherein each one of said memory columns comprises a plurality of random access memory cells;

column configuration logic coupled to said plurality of memory columns, wherein said column configuration logic receives a mode select signal which selects between a first mode of operation and a second mode of operation, wherein said column configuration logic operates in said first mode of operation to configure said plurality of memory columns into a first number of column groups wherein each one of said first number of column groups comprises a first equal number of said memory columns, and wherein said column configuration logic operates in said second mode of operation to configure said plurality of memory columns into a second number of column groups wherein each one of said second number of column groups comprises a second equal number of said memory columns;

column select logic which receives said mode select signal, and wherein said column select logic receives and decodes an address and correspondingly provides a plurality of select signals;

mux logic coupled to said plurality of memory columns and to said column select logic, wherein said mux logic receives said plurality of select signals, and wherein said mux logic selects an addressed set of said memory columns corresponding to said select signals;

wherein said mux logic selects one of said first equal number of said memory columns from each one of said first number of column groups in response to said select signals when said mode select signal selects said first mode of operation, and wherein said mux logic selects one of said second equal number of said memory columns from each one of said second number of column groups in response to said select signals when said mode select signal selects said second mode of operation; and wherein said addressed set of said memory columns selected by said mux logic corresponds to one of the words stored in said memory device, and wherein the word width is indicated by said first number when said first mode of operation is selected and the word width is indicated by said second number when said second mode of operation is selected.

5. The memory device according to claim 4, wherein said column configuration logic comprises a plurality of passgates, wherein said plurality of passgates is controlled by said mode select signal to divide said plurality of memory columns into said first number of column groups when said mode select signal indicates said first mode of operation, and wherein said plurality of passgates is controlled by said mode select signal to divide said plurality of memory columns into said second number of column groups when said mode select signal indicates said second mode of operation.

6. The memory device according to claim 4:

wherein said mux logic comprises a plurality of passgates;

wherein each one of said plurality of passgates is coupled to one of said plurality of memory columns; and wherein each one of said plurality of passgates receives one of said plurality of select signals;

wherein only one of said plurality of select signals is active for each one of said first number of column groups when one of said words is accessed, wherein only one of said plurality of passgates receives said active select signal for said each one of said first number of column groups;

wherein only one of said first equal number of said memory columns is selected from each one of said first number of column groups when one of said words is being accessed;

wherein only one of said plurality of select signals is active for each one of said second number of column groups when one of said words is accessed, wherein only one of said plurality of passgates receives said active select signal for said each one of said second number of column groups;.

wherein only one of said second equal number of said memory columns is selected from each one of said second number of column groups when one of said words is being accessed.

7. The memory device according to claim 4, wherein said column select logic comprises:

configuration control logic;

decode logic coupled to said configuration control logic, wherein said decode logic performs a binary decode of said address and provides said binary decode of said address to said configuration control logic;

wherein said configuration control logic receives said binary decode and receives said mode select signal, wherein said configuration control logic correspondingly generates said select signals to select between said first equal number of said memory columns when said mode select signal indicates said first mode of operation, and wherein said configuration control logic generates said select signals to select between said second equal number of said memory columns when said mode select signal indicates said second mode of operation.

8. In an x-y array of random access memory, wherein the x-y array comprises random access memory (RAM) cell columns organized in groups and providing column state signals indicating a memory state for each column, a reconfigurable column structure, comprising:

first logic which receives a first number of said column state signals from a first group of RAM cell columns, and wherein said first logic provides a first column bit signal corresponding to one of said first number of said column state signals;

second logic which receives a second number of said column state signals from a second group of RAM cell columns, and wherein said second logic provides a second column bit signal corresponding to one of said second number of said column state signals;

third logic which receives a third number of said column state signals from a third group of RAM cell columns, and wherein said third logic provides a third column bit signal corresponding to one of said third number of said column state signals;

fourth logic which receives a fourth number of said column state signals from a fourth group of RAM cell columns, and wherein said fourth logic provides a fourth column bit signal corresponding to one of said fourth number of said column state signals;

column configuration logic which receives a mode select signal which selects between a first mode and a second mode, wherein said column configuration logic receives said first, second, third, and fourth column bit signals, and wherein said column configuration logic provides a first memory bit signal, a second memory bit signal, and a third memory bit signal;

wherein said mode select signal selects said first mode, said first memory bit signal indicates the memory state of one of said RAM cell columns selected from said first group, and wherein said mode select signal selects said second mode, said first memory bit signal indicates the memory state of one of said RAM cell columns selected from said first group and said second group;

wherein said mode select signal selects said first mode, said second memory bit signal indicates the memory state of one of said RAM cell columns selected from said second group and said third group; and wherein said mode select signal selects said first mode, said third memory bit signal indicates the memory state of one of said RAM cell columns selected from said fourth group, and wherein said mode select signal selects said second mode, said third memory bit signal indicates the memory state of one of said RAM cell columns selected from said third group and said fourth group.

9. The reconfigurable column structure of claim 8, further comprising:

column select logic, wherein said column select logic receives said mode select signal;

wherein said column select logic provides a first plurality of column select signals to said first logic, and wherein said first logic receives said first plurality of column select signals;

wherein said column select logic provides a second plurality of column select signals to said second logic, and wherein said second logic receives said second plurality of column select signals;

wherein said column select logic provides a third plurality of column select signals to said third logic, and wherein said third logic receives said third plurality of column select signals;

wherein said column select logic provides a fourth plurality of column select signals to said fourth logic, and wherein said fourth logic receives said fourth plurality of column select signals;

wherein said mode select signal selects said first mode, said first plurality of column select signals selects said one of said RAM cell columns for which said first memory bit signal indicates the memory state, said second and third pluralities of column select signals select said one of said RAM cell columns for which said second memory bit signal indicates the memory state, and said fourth plurality of column select signals selects said one of said RAM cell columns for which said third memory bit signal indicates the memory state; and wherein said mode select signal selects said second mode, said first and second pluralities of column select signals select said one of said RAM cell columns for which said first memory bit signal indicates the memory state, and said third and fourth pluralities of column select signals select said one of said RAM cell columns for which said third memory bit signal indicates the memory state.

10. The reconfigurable column structure of claim 8, wherein said column configuration logic further comprises passgate logic;

wherein said mode select signal selects said first mode, said passgate logic couples said third column bit signal to said second column bit signal to generate said second memory bit signal; and wherein said mode select signal selects said second mode, said passgate logic couples said second column bit signal to said first column bit signal to generate said first memory bit signal, and said passgate logic couples said third column bit signal to said fourth column bit signal to generate said third memory bit signal.

11. The reconfigurable column structure of claim 8, wherein said first number is equal to said fourth number, and wherein said second number is equal to said third number.

12. The reconfigurable column structure of claim 11, wherein said second number is equal to half said first number.

13. A reconfigurable x-y random access memory (RAM) array for storing words of information comprising a width of bits stored within the array, wherein said words are accessed in said array, the array comprising:

a plurality of RAM columns;

first circuitry for receiving a mode select signal which selects between a first configuration mode and a second configuration mode, wherein said first circuitry operates in said first configuration mode to configure said plurality of RAM columns in a first number of groups, and operates in said second configuration mode to configure said plurality of RAM columns in a second number of groups; and second circuitry for receiving said mode select signal, wherein said second circuitry operates in said first configuration mode to access one bit from each one of said first number of groups, and operates in said second configuration mode to access one bit from each one of said second number of groups;

wherein said width is determined by said first number for said first configuration mode, and wherein said width is determined by said second number for said second configuration mode.

14. The array according to claim 13, wherein said second circuitry comprises:

mux circuitry coupled to said plurality of RAM columns and receiving a plurality of select signals;

select circuitry which provides said plurality of select signals;

wherein said mux circuitry selects one of said plurality of RAM columns from each one of said first number of groups in said first configuration mode, and from each one of said second number of groups in said second configuration mode; and wherein said second circuitry provides a plurality of bit signals corresponding to said RAM columns selected by said mux circuitry.

15. The array of claim 14, wherein said first circuitry comprises a plurality of passgate circuits coupled to said second circuitry, wherein said plurality of passgate circuits combines said plurality of bit signals into a first word group in said first configuration mode and into a second word group in said second configuration mode, whereby said plurality of RAM columns is configured in said first number of groups for said first configuration mode and configured in said second number of groups for said second configuration mode.

16. A reconfigurable x-y memory system for storing words of information comprising bits, and wherein said words have a width, the x-y memory system comprising:

a memory array including a plurality of RAM columns;

column configuration logic adapted to receive a mode select signal which selects between a first mode and a second mode, wherein said column configuration logic operates in said first mode to configure said plurality of RAM columns in a first number of groups, wherein said x-y memory system has a first word width in said first mode, and operates in said second mode to configure said plurality of RAM columns in a second number of groups, wherein said x-y memory system has a second word width in said second mode; and select logic adapted to receive said mode select signal, wherein said select logic operates in said first mode to access one bit from each one of said first number of groups, and operates in said second mode to access one bit from each one of said second number of groups;

wherein said width is determined by said first number for said first mode, and wherein said width is determined by said second number for said second mode.

17. The x-y memory system according to claim 16, wherein said select logic comprises:

select circuitry which receives an address and provides a plurality of select signals;

mux circuitry which is coupled to said plurality of RAM columns and receives said plurality of select signals;

wherein said mux circuitry selects one of said plurality of RAM columns from each one of said first number of groups in said first mode, and from each one of said second number of groups in said second mode; and wherein said select logic provides a plurality of bit signals corresponding to said RAM columns selected by said mux circuitry.

18. The array of claim 17, wherein said column configuration logic comprises a plurality of passgate circuits coupled to said select logic, wherein said plurality of passgate circuits combines said plurality of bit signals into a first word group in said first mode and into a second word group in said second mode, whereby said plurality of RAM columns is configured in said first number of groups for said first mode and configured in said second number of groups for said second mode.

19. A digital signal processing system, comprising:

a digital signal processor which executes on instructions having a first bit width and operates on data having a second bit width;

a reconfigurable x-y random access memory (RAM) array coupled to said digital signal processor and for storing words of information having a memory bit width, the array comprising a plurality of RAM columns;

first circuitry for receiving a mode select signal which selects between a first configuration mode and a second configuration mode, wherein said first circuitry operates in said first configuration mode to configure said plurality of RAM columns in a first number of groups, and operates in said second configuration mode to configure said plurality of RAM columns in a second number of groups; and second circuitry for receiving said mode select signal, wherein said second circuitry operates in said first configuration mode to access one bit from each one of said first number of groups, and operates in said second configuration mode to access one bit from each one of said second number of groups;

wherein said width is determined by said first number for said first configuration mode, and wherein said width is determined by said second number for said second configuration mode.

20. The digital signal processing system of claim 19, wherein said first number corresponds to said first bit width and said second number corresponds to said second bit width.

* * * * *

UNITED STATES PATENT AND TRADEMARK OFFICE
CERTIFICATE OF CORRECTION

PATENT NO. : 5,737,767
DATED : April 7, 1998
INVENTOR(S) : Ram Agrawal, et. al.

It is certified that error appears in the above-indentified patent and that said Letters Patent is hereby corrected as shown below:

Claim 3, col. 8, line 30, please delete "circuitry operating to access" and substitute "select logic".

Signed and Sealed this

Twenty-eighth Day of July, 1998

Attest:

BRUCE LEHMAN

Attesting Officer    Commissioner of Patents and Trademarks